US007346486B2

(12) United States Patent
Ivancic et al.

(10) Patent No.: US 7,346,486 B2
(45) Date of Patent: Mar. 18, 2008

(54) SYSTEM AND METHOD FOR MODELING, ABSTRACTION, AND ANALYSIS OF SOFTWARE

(75) Inventors: Franjo Ivancic, Jersey City, NJ (US); Pranav N. Ashar, Belle Mead, NJ (US); Malay Ganai, Plainsboro, NJ (US); Aarti Gupta, Princeton, NJ (US); Zijiang Yang, Northville, MI (US)

(73) Assignee: NEC Laboratories America, Inc., Princeton, NJ (US)

( * ) Notice: Subject to any disclaimer, the term of this patent is extended or adjusted under 35 U.S.C. 154(b) by 80 days.

(21) Appl. No.: 11/040,409

(22) Filed: Jan. 21, 2005

(65) Prior Publication Data
US 2005/0166167 A1    Jul. 28, 2005

Related U.S. Application Data

(60) Provisional application No. 60/538,524, filed on Jan. 22, 2004.

(51) Int. Cl.
*G06F 9/45* (2006.01)
*G06F 7/60* (2006.01)
*G06F 9/44* (2006.01)
*G06F 11/00* (2006.01)

(52) U.S. Cl. ............................ 703/22; 703/2; 717/124; 717/141; 714/38

(58) Field of Classification Search ................ 716/4–5; 703/2, 22
See application file for complete search history.

(56) References Cited

U.S. PATENT DOCUMENTS 6,292,916 B1 * 9/2001 Abramovici et al. ........ 714/736
6,539,345 B1 * 3/2003 Jones et al. ..................... 703/2
6,665,848 B2 * 12/2003 Ben-David et al. ............ 703/2
6,944,848 B2 * 9/2005 Hartman et al. ............ 717/124
7,031,896 B1 * 4/2006 Yang .............................. 703/2
7,047,139 B2 * 5/2006 Shtrichman .................... 703/2
2002/0062463 A1 * 5/2002 Hines ........................... 714/38
2002/0087953 A1 * 7/2002 Hines ......................... 717/125
2003/0208351 A1 * 11/2003 Hartman et al. .............. 703/22
2003/0225552 A1 * 12/2003 Ganai et al. .................... 703/2
2004/0019468 A1 * 1/2004 De Moura et al. .............. 703/2
2004/0123254 A1 * 6/2004 Geist et al. ..................... 716/4
2005/0229044 A1 * 10/2005 Ball ............................. 714/38
2006/0190865 A1 * 8/2006 Yu et al. ......................... 716/5
2006/0282807 A1 * 12/2006 Ivancic et al. .................. 716/5
2007/0011671 A1 * 1/2007 Kahlon et al. .............. 717/170

OTHER PUBLICATIONS

Williams, R. et al. "Combining Decision Diagrams and SAT Procedures for Efficient Symbolic Model Checking," Carnegie Mellon University Feb. 2000.*
Rugina, R., et al., "Symbolic Bounds Analysis of Pointers, Array Indices, and Accessed Memory Regions,"PLDI 2000.

(Continued)

*Primary Examiner*—Hugh Jones
*Assistant Examiner*—Akash Saxena

(57) ABSTRACT

A system and method is disclosed for formal verification of software programs that advantageously translates the software, which can have bounded recursion, into a Boolean representation comprised of basic blocks and which applies SAT-based model checking to the Boolean representation.

2 Claims, 7 Drawing Sheets

OTHER PUBLICATIONS

Ganai, M.K. et al, "Combining Strength of circuit-based and CNF-based algorithms for a high performance SAT solver," Design Automation Conference, 2002.

Goldberg, E. and Novikov, Y., "Berkmin: A fast and robust SAT solver," in Design Automation and Test in Europe, pp. 132-139, 2002.

Marques-Silva, J.P. and Sakallah, K.A., "GRASP: A search algorithm for prepositional satisfiability," IEEE Transactions on Computers, vol. 48, pp. 506-521, 1999.

Moskewicz, M. et al, "Chaff: Engineering an efficient SAT solver," in Design Automation Confernece, 2001.

Gupta, A. et al, "Iterative absrtraction using SAT-based BMC with proof analysis," International Conference on Computer-Aided Design (ICCAD), pp. 416-423, Nov. 2003.

Necula, G.C. et al, "CIL: Intermediate language . . . of C Programs," Proc. of the 11th Int.Conf. on Computer Construction, LNCS, pp. 213-228, Springer-Verlag, 2002.

Tip, F., "A survey of programe slicing techniques," J. of Programming Languages, vol. 3, No. 3, pp. 121-189, Sep. 1995.

McMillan, K., "Applying SAT Methods In Unbounded Model Checking,"CAV 2002, pp. 250-264, 2002.

* cited by examiner

Algorithm 1 SET CREATE_BASIC_BLKS(ENTRY_BLK, STATEMENT)

1: set exit=∅;
2: if statement is of type "if (cond) {statement1} else {statement2}" then
3:   add_to_basic_blks(entry_blk, cond);
4:   entry1 = init_basic_blk();
5:   exit1 = create_basic_blk(entry1, statement1);
6:   create_edge(entry_blk, entry1, cond);
7:   if statement2 == ∅ then {else-part is missing in if-statement}
8:     exit = exit1 ∪ {(entry_blk, ¬cond)};
9:   else
10:    entry2 = init_basic_blk();
11:    exit2 = create_basic_blks(entry2, statement2);
12:    create_edge(entry_blk, entry2, ¬cond);
13:    exit = {exit1} ∪ {exit2};
14:   end if
15: else if statement is of type "while (cond) {body}" then
16:   cond_blk = init_basic_blk_with(cond);
17:   create_edge(entry_blk, cond_blk, TRUE);
18:   body_blk = init_basic_blk();
19:   body_exit = create_basic_blks(body_blk, body);
20:   create_edge(cond_blk, body_blk, cond);
21:   exit_blk = init_basic_blk();
22:   create_edge(cond_blk, exit_blk, ¬cond);
23:   for all (blki, condi) ∈ body_exit do
24:     create_edge(blki, cond_blk, condi);
25:   end for
26:   exit = (exit_blk, TRUE);
27: else if statement is of type "goto label" then
28:   label_blk = get_block_with_label(label);
29:   if label_blk then
30:     create_edge(entry_blk, label_blk, TRUE);
31:   else
32:     append_goto_blk_array(label, entry_blk);
33:   end if
34: else if statement is of type "label labeled_statement" then
35:   label_blk = init_basic_blk_with(labeled_statement);
36:   create_edge(entry_blk, label_blk, TRUE);
37:   blk_array = get_blks_with_goto_label(label);
38:   for all blk ∈ blk_array do
39:     create_edge(blk, label_blk, TRUE);
40:   end for
41: else if statement has function call then
42:   exit = create_func_blocks(statement, entry_blk);
43: else
44:   add_to_basic_blk(entry_blk, statement);
45: end if
46: return (exit);

FIG. 2

Algorithm 2 SET CREATE_FUNC_BLOCKS(STATEMENT, ENTRY_BLK)

1: set exit=∅;
2: parse statement and get the called function name and actual parameters: called_func, actual_params ;
3: if basic blocks have not been created for called_func then
4:   create basic blocks for called_func;
5: end if
6: obtain formal parameters from called_func: formal_params;
7: for $f \in$ formal_params, $a \in$ actual_params do
8:   add_to_basic_blk(entry_blk, f=a);
9: end for
10: get the entry basic block in called_func: func_entry_blk
11: create_edge(entry_blk, func_entry_blk, TRUE);
12: post_func_blk = init_basic_blk();
13: if statement is an assignment: var = called_func(...) then
14:   get return statement from called_func: return_stmt;
15:   add_to_basic_blk(post_func_blk, var=return_stmt);
16: end if
17: exit = {(post_func_blk, TRUE)};
18: return (exit);

FIG. 3

```
int global =   0;
int bar(int a , int b ) {
  int x,y ;
  x = a + 1;                                  //0->(3)
  y = b + 1;                                  //0->(3)
  foo(x, a);                                  //0->(3) and
  return (x + y);                             //2->(21,25)
}
void foo(int a , int b ) {
  if (a >= b)                                 //3->(4,5)
    global = global + 1;                      //4->(5)
  return;                                     //5->(1,19,23
}
int main(void){
  int a,b,c;
  a = 5;                                      //6->(7,8)
  b = 0;                                      //6->(7,8)
  c = 3;                                      //6->(7,8)

if (a == 5) {                               //6->(7,8)
    goto switch_0_5;                          //7->(11)
  } else {
    if (1) {                                  //8->(9,10)
      goto switch_0_default;                  //9->(12)
    } else {
      if (0) {                                //10->(11,14)
        switch_0_5: goto switch_0_break;      //11->(13)
        switch_0_default: b = 6;              //12->(13)
        goto switch_0_break;                  //13->(15)
      } else
        switch_0_break:    ;                  //14->(16)
    }
  }
  if (b == 5) {                               //15->(16,18)
    if (c == 3)                               //16->(17,18)
      FOUND_5: b = 5;                         //17->(18)
  }
  foo(a, b);                                  //18->(3) and 19->(20)
  c = bar(1, 0);                              //20->(0) and 21->(22)
  foo(a, c);                                  //22->(3) and 23->(24)
  c = bar(c, 0);                              //24->(0) and 25->(26)
  foo(a, c);                                  //26->(3) and 27->(28)
  if (global == 1) {                          //28->(29,30)
    GLOBAL_1: b = global;                     //29->(28)
  } else {
    if (global == 5)                          //30->(31,32)
      GLOBAL_5: b = a;                        //31->(32)
  }
  return (a);                                 //32
}
```

FIG. 4

```
int foo(int s){
  int t=s+2;
  if (t>6)
    t -= 3 ;
  else
    t--;
  return t;
} void bar(){
  int x = 3, y = x - 3;
  while ( x <= 4 ){
    y++ ;
    x = foo(x);
  }
  y = foo(y);
}
```

| $c_1$ $c_2$ $\cdots$ $c_n$ | $c'_1$ $c'_2$ $\cdots$ $c'_n$ | condition |
|---|---|---|
| $v_1^1$ $v_2^1$ $\cdots$ $v_n^1$ | $v_1^{1'}$ $v_2^{1'}$ $\cdots$ $v_n^{1'}$ | $k^1$ |
| $v_1^2$ $v_2^2$ $\cdots$ $v_n^2$ | $v_1^{2'}$ $v_2^{2'}$ $\cdots$ $v_n^{2'}$ | $k^2$ |
| $\cdots \cdots$ | $\cdots \cdots$ | $\cdots$ |
| $v_1^m$ $v_2^m$ $\cdots$ $v_n^m$ | $v_1^{m'}$ $v_2^{m'}$ $\cdots$ $v_n^{m'}$ | $k^m$ |

FIG. 6

Algorithm 3 VECTOR CREATE_CIRCUIT(STATEMENT)
---
1: if statement is of type "expr1&expr2" then
2:    vec1 = create_circuit(expr1);
3:    vec2 = create_circuit(expr2);
4:    for (i=0;i<bitw;i++) do
5:      result[i] = AND_gate(vec1[i],vec2[i]);
6:    end for
7: else if statement is of type "expr1+expr2" then
8:    vec1 = create_circuit(expr1);
9:    vec2 = create_circuit(expr2);
10:    carry_in = zero;
11:    for (i=0;i<bitw;i++) do
12:      result[i] = XOR_gate(XOR_gate(vec1[i],vec2[i]), carry_in);
13:      and1 = AND_gate(vec1[i],vec2[i]);
14:      and2 = AND_gate(vec1[i],carry_in);
15:      and3 = AND_gate(vec2[i],carry_in));
16:      carry_in = OR_gate(OR_gate(and1, and2), and3);
17:    end for
18: else if statement is of type "expr1==expr2" then
19:    vec1 = create_circuit(expr1);
20:    vec2 = create_circuit(expr2);
21:    result[0] = one;
22:    for (i=0;i<bitw;i++) do
23:      result[0] = AND_gate(XNOR_gate(vec1[i],vec2[i]), result[0]);
24:    end for
25: else if statement is a constant NUM then
26:    len = the bit width of NUM;
27:    for (i=0; i<len; i++) do
28:      bit_val = (NUM>>i) & 0x1;
29:      result[len-1-i] = bit_val?one:zero;
30:    end for
31: else if statement is a variable VAR then
32:    len = the bit width of VAR;
33:    for (i=0; i<len; i++) do
34:      result[i] = create_signal();
35:    end for
36: end if
37: return (result);

FIG. 7

SYSTEM AND METHOD FOR MODELING, ABSTRACTION, AND ANALYSIS OF SOFTWARE

This application claims the benefit of U.S. Provisional Application Ser. No. 60/538,524, entitled "SYSTEM AND METHOD FOR MODELING, ABSTRACTION, AND ANALYSIS OF SOFTWARE," filed on Jan. 22, 2004, the contents of which are incorporated by reference.

This application is related to U.S. Utility patent application Ser. No. 10/157,486, entitled "EFFICIENT APPROACHES FOR BOUNDED MODEL CHECKING," filed on May 30, 2002, the contents of which are incorporated by reference.

BACKGROUND OF THE INVENTION

The present invention is related to techniques for formal analysis and verification of software.

Model checking is an automatic technique for the verification of concurrent systems. It has several advantages over simulation, testing, and deductive reasoning, and has been used successfully in practice to verify complex sequential circuit designs and communication protocols. See E. M. Clarke, O. Grumberg, and D. A. Peled, "Model Checking," MIT Press, 2000. In particular, model checking is automatic, and, if the design contains an error, model checking produces a counter-example (i.e., a witness of the offending behavior of the system) that can be used for effective debugging of the system. While symbolic model checking using binary decision diagrams (BDDs) offer the potential of exhaustive coverage of large state-spaces, it often does not scale well enough in practice. An alternative approach is bounded model checking (BMC) focusing on the search for counter-examples of bounded length only. See A. Biere, A. Cimatti, E. M. Clarke, M. Fujita, and Y. Zhu, "Symbolic model checking using SAT procedures instead of BDDs," Proc. of the 36$^{th}$ ACM/IEEE Design Automation Conference, pp. 317-20 (1999). Effectively, the problem is translated to a Boolean formula, such that the formula is satisfiable if and only if there exists a counter-example of length k. In practice, k can be increased incrementally starting from one to find a shortest counter-example if one exists. However, additional reasoning is needed to ensure completeness of the verification when no counter-example exists. The satisfiability check in the BMC approach is typically performed by what is known as a back-end SAT-solver. See, e.g., M. K. Ganai, L. Zhang, P. Ashar, and A. Gupta, "Combining strength of circuit-based and CNF-based algorithms for a high performance SAT solver," in Design Automation Conference, 2002; E. Goldberg and Y. Novikov, "Berkmin: A fast and robust SAT solver," in Design Automation and Test in Europe, pages 132-39, 2002; J. P. Marques-Silva and K. A. Sakallah, "GRASP: A search algorithm for prepositional satisfiability," IEEE Transactions on Computers, 48: 506-21, 1999; and M. Moskewicz, C. Madigan, Y. Zhao, L. Zhang, and S. Malik, "Chaff: Enginnering an efficient SAT solver," in Design Automation Conference, 2001.

Recently, it has been proposed to apply bounded model checking techniques to the formal verification of software such as C programs. See E. Clarke, D. Kroening, "Hardware Verification using ANSI-C Programs as a Reference," Proceedings of ASP-DAC 2003, pp. 308-11 (January 2003). In this approach, a C program is translated into a monolithic SAT formula, namely a bit vector equation, which is then used with SAT-based bounded model checking to check consistency properties, including checking the equivalence of the C program to a register-transfer level (RTL) hardware design. Each individual statement in the C program is considered to be an atomic component of the program. Unfortunately, this statement-based approach has limitations in terms of concisely handling loops and functions and does not take full advantage of recent advances in model checking.

SUMMARY OF INVENTION

A verification system and method for software is disclosed which advantageously translates a software program into a Boolean representation based on one or more basic blocks. Rather than dealing with individual statements as the atomic components of the software program, each basic block can represent a sequence of instructions in the software program as a set of parallel assignments and a set of transitions to other basic blocks. Then, a model checker, such as a back-end SAT solver that uses bounded model checking, can be applied to the Boolean representation. The model checker proceeds by iteratively unrolling the basic blocks, each unrolling understood to be one step in a block-wise execution of the software program. The state of the system can be defined to contain a location indicating the current active basic block and the evaluation of all variables in scope. Thus, a label can be generated for each basic block and a program counter variable introduced to track progress of allowed executions of the software program during the model checking. Each unrolling of a basic block by the model checker advantageously has a limited number of successors. Although each unrolling introduces the whole software program into the satisfiability problem of the model checker, many basic blocks in the new unrolling can be declared unreachable by purely considering the control flow of the software program. Thus, knowledge of the model generation process can be incorporated into the decision heuristics used by the model checker to further improve the efficiency of the verification.

The software program can be abstracted in a manner that advantageously contains both abstracted and concrete data variables. This allows a seamless tradeoff between accuracy and easy of analysis, potentially enabling accurate analysis with a fewer number of abstraction-refinement iterations. The use of predicate abstraction for the analysis of the software can be improved by computing the transition relations amongst basic blocks using symbolic predicate abstraction and the use of approximate transition relations. The combination of the two approaches, as well as the inclusion of heuristics to compute the many transition relations found in a whole software program more efficiently by proper scheduling of computations and memorizing of partial results, results in a more efficient approach to computing the transition relations.

Code simplification can be applied automatically in a manner that does not affect the semantics of the program. Range analysis can be performed prior to modeling in order to limit the size of the variables in the Boolean representation of the software program. Program slicing can be performed to decompose the software program into semantically meaningful decompositions where the elements are not necessarily textual continuous.

Refinement analysis based on spurious transitions, fragments and full paths can be used in an efficient manner by keeping the learnt clauses persistent during the abstraction-refinement iterative loop, promising a more efficient implementation of a counter-example-guided abstraction refinement framework.

The verification system and method disclosed herein provides for faster and more efficient operation and is applicable to a wider range of software applications than in the prior art. These and other advantages of the invention will be apparent to those of ordinary skill in the art by reference to the following detailed description and the accompanying drawings.

BRIEF DESCRIPTION OF DRAWINGS

FIG. 2 is pseudo-code for constructing basic blocks from a software program.

FIG. 3 is pseudo-code for constructing basic blocks from a software program which includes non-recursive function calls.

FIG. 4 is example C code that shows the control flow information generated for the code.

FIG. 6 is a truth table for the control logic.

FIG. 7 is pseudo-code for constructing combinational circuits to obtain the variable assignment logic.

DETAILED DESCRIPTION

Figure 1:
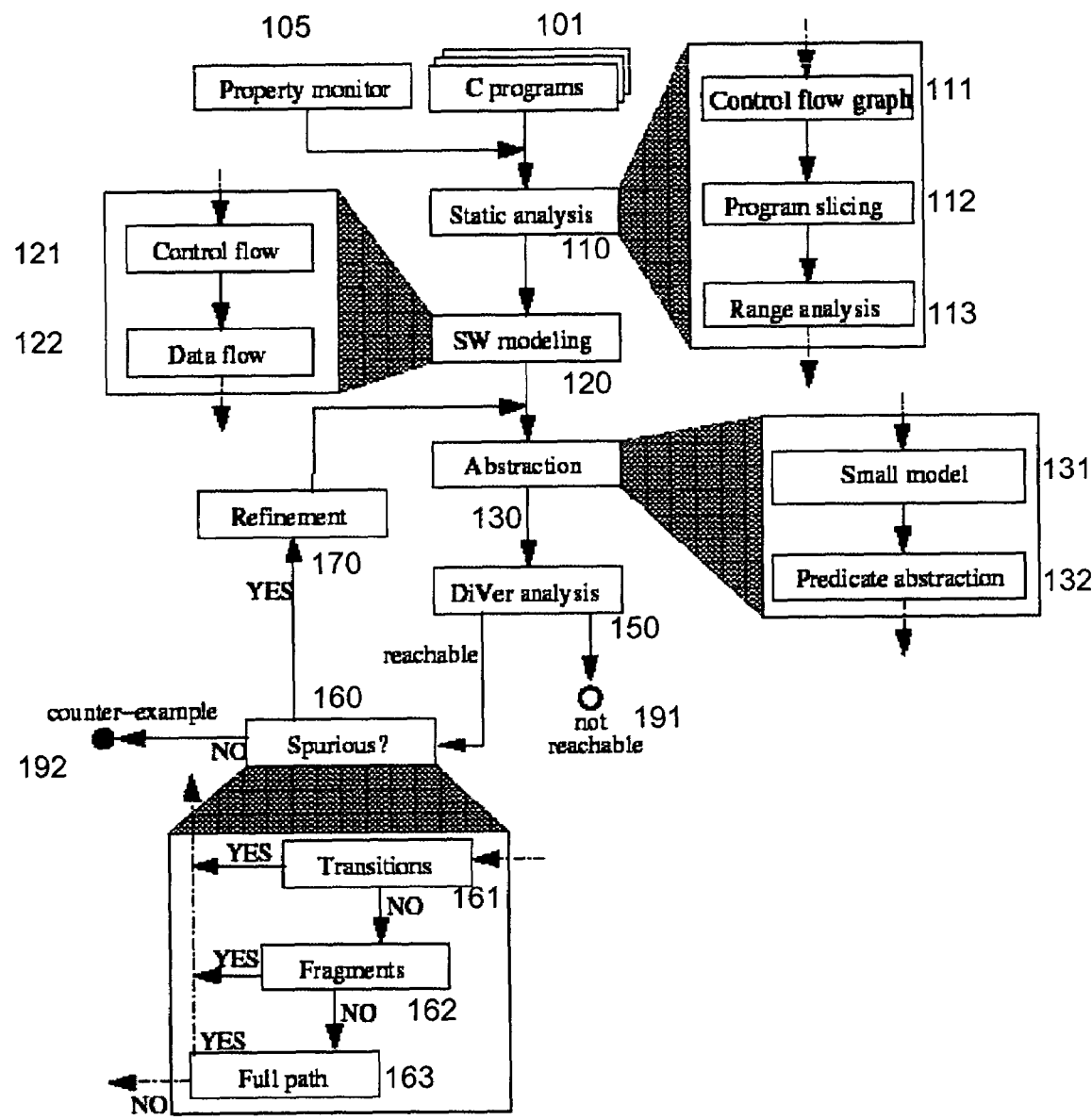
FIG. 1 shows an abstract diagram illustrating the processing performed on a software program in accordance with an embodiment of the present invention.

FIG. 1 is an abstract diagram illustrating the operation of a verification system, in accordance with an embodiment of the present invention. The input to the system is a software program 101 and a representation 105 of the property to be checked. The output of the system is a result that either proves that the software program 101 satisfies the property at 191 or provides a counter-example that disproves the property at 192 (or the analysis can terminate without a conclusive result due to resource constraints such as a time-out or memory exhaustion).

The software program 101 to be analyzed can be input as a source code file or a set of source code files written in a programming language, such as the C programming language. The present invention shall be described herein with particular reference to a subset of the C programming language allowing bounded recursion, although the present invention is not limited to C and may readily be extended by one of ordinary skill in the art to other programming languages. The property representation 105 to be checked can come from a variety of sources and be specified in a number of different ways. For example, and without limitation, an advantageous property to check is reachability, i.e. whether a particular part of the source code is reachable. An advantageous mechanism for specifying the property is by modifying the source code to include a property monitor 105, namely a small portion of code that monitors the selected property for the system. Where reachability properties are involved, for example, the property monitor 105 can be provided by a label such as "ERROR_LABEL:" at the line of source code that is to be analyzed for reachability. The process of constructing the property monitor 105 can be readily automated by using, for example, a script. FIG. 1 assumes, without limitation, that the property to be checked is a reachability property.

The system performs an automated analysis of the software program, in the form of a static analysis 110, a modeling step 120, and an abstraction step 130, which are further described below. The result is a translation of the program into a Boolean representation that can be analyzed by a back-end model checker at 150.

In accordance with an embodiment of an aspect of the invention, the software program 101 is translated by the system into one or more "basic blocks." Rather than dealing with individual statements as the atomic components of the software program, as done in the prior art, each basic block of the software can contain a series of sequential instructions from the software program. A basic block can represent a (possibly empty) set of assignments followed by a (possibly empty) set of guarded (conditional) transitions leading to other basic blocks. By grouping the sequential assignments into a single basic block, these instructions can be rewritten into a set of parallel assignments. This can be accomplished, for example, by replacing certain variables appearing on the left-hand side of an assignment of an instruction inside a basic block with the expression that it was assigned previously in the same basic block if such an assignment occurs as a previous instruction in the basic block. The state of the system can be advantageously defined to contain a location indicating the current active basic block and the evaluation of all variables in scope. A bounded-length stack (per process) can be added to the set of global variables to model a function call stack, which allows modeling of bounded recursion.

The model checking of the Boolean representation of the software program, at 150 in FIG. 1, proceeds by unrolling the basic blocks, rather than the individual statements of the software program. A label can be generated for each basic block, and a program counter variable can be introduced to monitor the progress in the state transition graph composed of the basic blocks. The program counter variable can be used to track progress of the allowed executions of the software program during the model checking. An unrolling during the model checking is understood to be one step in a block-wise execution of the software program. In the context of bounded model checking, this is an efficient way of processing the software program, since, for each basic block, there are only a limited number of possible successors. Given a single initial block label, there is only a limited number of possible next blocks reachable in new unrollings. Although each unrolling introduces the whole software program into the satisfiability problem, many blocks in the new unrolling can be declared unreachable by merely considering the control flow of the software program. Thus, the search space can be pruned considerably.

Moreover, the model checking at 150 in FIG. 1 can proceed in a manner that incorporates knowledge of the model generation process into the decision heuristics. The program counter variable can be used by the model checker to eliminate many unreachable basic blocks in new unrollings, thereby increasing the likelihood that the model checker can decide based on the program counter variable.

FIG. 1, as stated above, assumes that the property checked by the model checker 150 is a reachability property. If the model checker 150 proves that the specified section of the software program 101 is not reachable in the abstracted Boolean representation, it is guaranteed that the section is not reachable in the original source code for the software program 101—thus, ending the verification procedure at 191 in FIG. 1. If the model checker 150 discovers a counter-example, a check is made at 160 to see if the counter-example is spurious. If the analysis of the counter-example at 160 determines that the path is actually feasible in the original software program, a concrete counter-example has been discovered—thereby, ending the verification procedure at 192 in FIG. 1. Otherwise, the Boolean representation is refined at 170 in order to obtain a new representation for the model checker 150.

Although the present invention is not limited to any specific model checking architecture, it is advantageous to use a Boolean verification framework that utilizes advanced SAT-based and BDD-based methods for performing both bounded and unbounded verification. An example of such a system is the DiVER system, which is described in U.S. Utility patent application Ser. No. 10/157,486, entitled "EFFICIENT APPROACHES FOR BOUNDED MODEL CHECKING," filed on May 30, 2002, the entire contents of which is incorporated by reference herein and Aarti Gupta, Malay K. Ganai, Zijiang Yang, and Pranav Ashar, "Iterative Abstraction using SAT-based BMC with Proof Analysis," In Proceedings of International Conference on Computer-Aided Design (ICCAD), pp. 416-423 (November 2003).

With reference to FIG. 1, the processing involved in the static analysis 110, the modeling 120, and the abstraction 130 are further described in detail below. Also, the process of analyzing for spurious counter-examples at 170 and refinement at 180 are further described in detail below.

STATIC ANALYSIS. It is preferable to perform some code simplification before further processing of the software 101. For example, it can be advantageous to remove nested or embedded function calls inside other function calls by adding temporary variables. It can also be advantageous to rewrite statements with side-effects into equivalent code that does not contain statements with side-effects. See G. C. Necula, S. McPeak, S. P. Rahul, and W. Weimer, "CIL: Intermediate Language and Tools for Analysis and Transformation of C Programs," Proceedings of the 11$^{th}$ International Conference on Computer Construction, LNCS, pp. 213-28, Springer-Verlag (2002).

As depicted in FIG. 1, a static analysis 110 is performed on the software. At 111, a control flow graph of the software is computed which is used in the subsequent processing for the modeling of the software. During construction of the control flow graph, it is preferable that variables be renamed to have a unique name for the entire software program, allowing all variables to be treated as globally defined. It is also preferable to flatten out recursive data structures, for example by specifying a bound on the length of such data structures, in order to guarantee a finite model that can be used for analysis purposes.

In accordance with another aspect of the invention, it is also advantageous to perform pre-processing such as program slicing 112 and range analysis 113 as part of the analysis framework. A "slice" of a program with respect to a set of program elements is a projection of the program that includes only program elements that might somehow affect the values of variables used at members of the considered set of program elements. See F. Tip, "A Survey of Program Slicing Techniques," Journal of Programming Languages, Vol. 3, No. 3, pp. 121-189 (September 1995). Slicing, thus, allows the system to find a semantically meaningful decomposition of the program where the decompositions consist of elements that are not necessarily textually continuous. Range analysis techniques can also be used to limit the number of bits needed to represent the various statements in the software. See R. Rugina and M. C. Rinard, "Symbolic Bounds Analysis of Pointers, Array Indices, and Accessed Memory Regions," SIGPLAN Conference on Programming Language Design and Implementation," pp. 182-95 (2000).

MODELING. As depicted in FIG. 1, the modeling 120 of the software considers two kinds of logic: control logic 121 and data logic 122. The control logic 121 describes the flow of control that can be represented by a control flow graph of the basic blocks. The data logic 122 describes the assignments of variables given finite ranges. Assuming the software program consists of N basic blocks, each basic block can be represented by a label of $\lceil \log N \rceil$ bits. A program counter variable of $\lceil \log N \rceil$ bits can be introduced to monitor progress in the graph of the basic blocks. The control logic defines the transition relation for this program counter variable given the basic block graph and the conditions guarding some of the transitions between the basic blocks. The transitions, thus, model transfer of control within the basic block graph representing the software program. The program counter variable can be used to track progress of allowed executions of the software program during the model checking phase. Each basic block of the source code can be replaced by a tight bit-blasted version of the data variables as well as the control logic given the aforementioned program counter variable and the basic block labels.

Similar modeling approaches have been explored in prior art software model checking tools (such as Verisoft, Java Pathfinder, and Bogor), but limited to a non-bounded model checking setting. The software modeling is herein described in a manner that takes advantage of recent progress in SAT-based bounded model checking, while also improving the efficiency of software verification by customizing the back-end model checker.

As discussed above, each basic block contains a (possibly empty) set of assignments with a (possibly empty) set of guarded (conditional) transitions leading to other basic blocks. The basic block can be structured more formally as follows. The set of all variables in the program is denoted by X. A type-consistent evaluation of all variables in X is denoted by x, and the set of all type-consistent evaluations is denoted by $\mathcal{X}$, while the set of allowed C-expressions is represented by $\Sigma$. Then, the parallel assignments of a basic block can be written as $v_1, \ldots, v_n \leftarrow e_1, \ldots, e_n$, where $V=\{v_1, \ldots, v_n\} \subseteq X$ and $E=\{e_1, \ldots, e_n\} \subseteq \Sigma$. The set V can be referred to as the assignment set of the block. The set of locally active variables of a basic block l can be denoted as $X_l$ and the set of type-consistent evaluations with $\mathcal{X}_l$. A function Vars: $\Sigma \rightarrow 2^X$ denotes the set of variables that occur in a C-expression $\sigma \in \Sigma$ using Vars($\sigma$). The set Vars($\sigma$)$\subseteq$X includes variables that correspond to pointers, pointers of pointers, etc., of variables mentioned in a as well as address dereferences. This function is generalized naturally to Vars: $2^\Sigma \rightarrow 2^X$ as Vars(E)=$\cup_{e \in E}$ Vars(e). For a particular C-block with assignment set V$\subseteq$X the set of required variables R can then be defined as R=Vars(E) and the set of unused variables U as U=X\(Vars(V)$\cup$R).

In this framework, a state of the program can be defined to comprise a location l$\in$L describing the current basic block and a type-consistent evaluation of data variables x$\in\mathcal{X}_l$ where out-of-scope variables at location l are assigned the undefined value $\bot$. The set of initial states is $Q_0=\{(l_0, x)|$ x$\in\mathcal{X}_{l_0}\}$ where the initial state of the program is considered to be completely random in a single location $l_0$ where each variable in X can take a value that is type-consistent with its specification. A bounded-length stack (per process) can be added to the set of global variables to model a function call stack, thereby allowing modeling of bounded recursion.

Control Logic. The control flow graph for the software program is a finite graph G=(L, E) where L consists of basic blocks/locations and E denotes the edges between basic blocks representing transfer of control. Except the first and last instruction, the instructions in each basic block have a unique predecessor and successor. FIG. 2 sets forth pseudo-code for the construction of basic blocks for some programming statements such as if, goto, etc. The main function CREATE_BASIC_BLKS is recursive. The first parameter entry_blk is the entry block to the current statement. The second parameter statement is the current statement. Depending on its type, statement may or may not become part of entry_blk. The function returns a set called exit which consists of pairs of basic blocks and conditions and is used to correctly connect outgoing edges to the following basic block which has not been created yet. Assume |exit|>1 and next_blk will be the first basic block of the next statement. Then, for any (blk, cond) ∈exit, there is a guarded transition from blk to next_blk with condition cond. The following describes how the syntax is processed in FIG. 2:

- if (cond) {statement1} else {statement2} The condition cond joins the entry block because there is no branch between the previous statement and the condition. Since the control branches over cond, it is advantageous to initialize new basic blocks entry1 and entry2 to be the entry blocks for statement1 and statement2, respectively. The basic blocks of statement1 and statement2 are then created recursively. There are edges (entry_blk entry1) with the condition cond to be true, and (entry_blk→entry2) with the condition cond to be false. Finally, the exit blocks of the if statement are the union of the exit locks of statement1 and statement2.
- while (cond) {body} Unlike the condition in an if statement that becomes part of entry_blk, the condition cond in a while statement starts a new block cond_blk because it is the destination of more than one basic blocks. Since the control may or may not transfer to body after cond, a new entry block body_blk is initialized and the basic blocks for body are created recursively. Let body_exit_blk$_i$(1≦i≦n) be the n exit blocks of body. There are unconditional edges (entry_blk→cond_blk) and (body_exit_blk$_i$→cond_blk). A new basic block exit_blk is initialized to be the block that contains the statement immediately after the while statement. There are two conditional edges (cond_blk→body_blk) with the condition cond to be true, and (cond_blk→exit_blk) with the condition cond to be false.
- goto label If the statement labeled by a label has already been parsed, an unconditional edge (entry_blk→label_blk) is created, where label_blk is the basic block that contains the labeled statement. Otherwise, the basic block that contains the goto statement, i.e. entry_blk, is stored in a hash table G. The keys of the entries in the hash table are the label strings of the goto statements, and the contents are a list of basic blocks that contains the goto statements with the same destination. The hash table is used to create edges when a label statement is parsed.
- label statement A new basic block label_blk is initialized for the labeled statement. It is preferable to create a new block so that the labeled statement may be the destination of goto statements, which makes the labeled statement destination of more than one basic block. Note that no basic blocks contain more than one labeled statement. If there are basic blocks in the hash table G that contain goto statement with the destination to this statement, an unconditional edge is created for each of the block to label_blk.
- function calls After simplification of the program code, there are only two types of function calls: function_call( ... ) and var=function_call( ... ). FIG. 3 sets forth pseudo-code for generating basic blocks for non-recursive function calls. If there is parameter passing, statements are added that assign actual parameters to corresponding formal parameters to the basic block entry_blk. Note that only call-by-value is considered in FIG. 3. If the basic blocks of the called function have not been called, basic blocks can be created for it at line 3. A non-conditional edge from entry_blk to the first basic block in called_func is created. If the function call is of type var=function_call( ... ), a statement can be added by assigning the return expression in called unc to var. The statement is added to the block post_func_blk that is the exit block of the function call statement.
- default By default a statement, such as an assignment, will not create any new basic blocks. In such a case, the statement is simply appended to the entry block.

FIG. 4 shows sample C code that illustrates the process of constructing the basic blocks. The code consists of three functions, and the control flow information is shown in the comments. The comments are in the form C→(N$_i$) which show the indices of the current and next basic blocks, where C is the index of the basic block to which the current statement belongs. Different statements may belong to the same basic block, e.g., the first two assignments in function bar( ). Note that each function call corresponds to two basic blocks although it is a single statement: one basic block holds parameter passing and the other basic block holds the returning position. N$_i$ is a list of destinations of the current basic block. The if statement has two destination basic blocks. Which one is chosen depends on the condition logic. The return statement in each function may have multiple destinations which correspond to multiple calling positions to this function.

Figure 5:
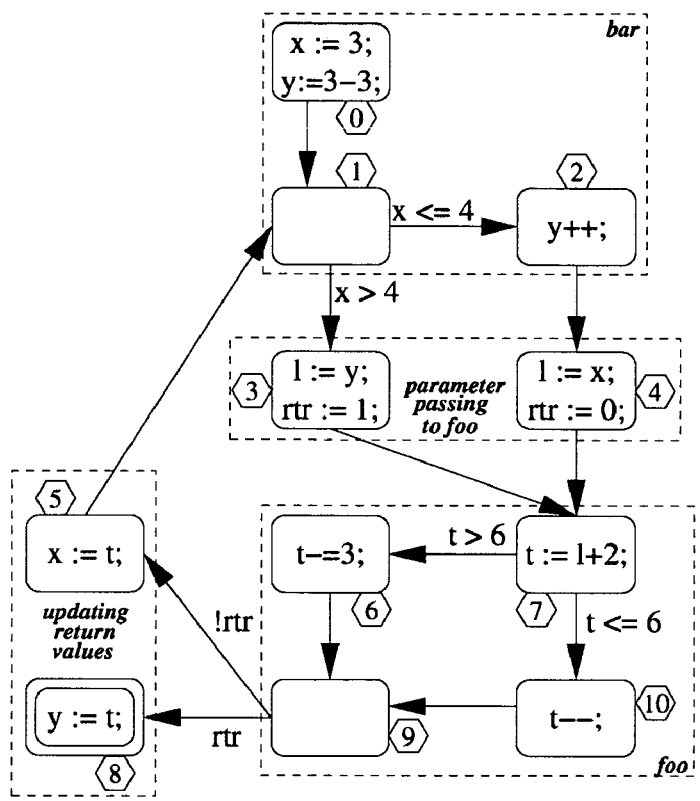
FIG. 5 is another example of C code with a control flow graph generated for the code.

FIG. 5 shows another example of sample C code along with the computed control flow graph on the right. The example again shows how the basic blocks are computed for various types. Each basic block is identified in FIG. 5 by a unique number shown inside the hexagons adjacent to the basic blocks. The source node of the control flow graph is basic block 0, while the sink node is the highlighted basic block 8. The example in FIG. 5 pictorially shows how non-recursive function calls can be included in the control flow of the calling function. A preprocessing analysis determines the function "foo" is not called in any recursive manner. The two return points are recorded by an encoding that passes a unique return location as a special parameter using the variable "rtr."

The control logic can be expressed using 2⌉logN⌈ bits, where N is the number of basic blocks in the program. FIG. 6 depicts a truth table for the control logic. In FIG. 6, $c_1$, $c_2$, ... $c_n$ denote the current state variable, and $c'_1$, $c'_2$, ... $c'_n$ denote the next state variable where n=⌉logN⌈. The jth table line represents a control flow graph edge ($v_1^j v_2^j \ldots v_n^j \rightarrow v_1'^j v_2'^j \ldots v_n'^j$) with condition $k^j$ where $v_i^j \in \{0, 1\}$ is an assignment to $c_i$ and $v_i'^j \in \{0, 1\}$ is an assignment to $c'_i$. Based on the truth table, it is possible to build the next state logic for each next state variable as:

$$f(c'_i) = \bigvee_{j: v_i'^j = 1} \left( k^j \wedge \bigwedge_{p: v_p^j = 1} c_p \wedge \bigwedge_{p: v_p^j = 0} \neg c_p \right).$$

Data Logic. The data logic can be constructed as follows. All of the variables after simplification have finite domains. Assume that t bits can be used to represent a variable var with $\text{var}_j (1 \leq j \leq t)$ being the current state bits and $\text{var}'_j$ $(1 \leq j \leq t)$ being the next state bits. Let var be assigned in blocks $\{b_1, b_2, \ldots b_k\}$ and not assigned in the remaining blocks $\{b_{k+1}, \ldots b_N\}$. The logic assigned to $\text{var}_j$ is $V_{ji}$ at block $b_i (1 \leq i \leq k)$. Also, let $I_i$ be the index of the basic block $b_i$. The data logic for $\text{var}_j$ is:

$$\text{var}'_j = \left( \bigvee_{i=1}^{k} (c_1 c_2 \ldots c_n = I_i) \wedge (V_{ji}) \right) \vee \left( \bigvee_{i=k+1}^{N} (c_1 c_2 \ldots c_n = I_i) \wedge (\text{var}_j) \right).$$

FIG. 7 shows pseudo-code for constructing combinational circuits in order to obtain the variable assignment logic. FIG. 7 shows how to construct the circuit based on some common expressions, bitwise AND '&', sum '+', equality '==', constant and variable. The function "AND_gate(bit1, bit2)" creates an AND gate with two inputs bit1 and bit2. Similarly, "OR_gate( )" and "XOR_gate( )" create two-input OR and XOR gate, respectively. Lines 2-6 in FIG. 7 handle the expression of type expr1&expr2. It first recursively builds a circuit for the sub-expressions expr1 and expr2. Let vectors vec1 and vec2 be the outputs of the circuits for expr1 and expr2. The result vector has the same bitwidth as vec1 and vec2. Each result bit is the output of an AND gate with two inputs being the corresponding bits in vec1 and vec2. Lines 8-17 in FIG. 7 handle the expression of type expr1+expr2. It creates an adder for each bit: var[i]=vec[i]⊕vec[i]⊕carry_in. The logic for carry_in is (vec1[i]∧vec2[i])∨(vec1[i]∧carry_in)∨(vec2[i]∧carry_in) with initial value being zero. As to the equality in lines 19-24 in FIG. 7, the result vector has only one bit. If the statement is a constant, the result vector is a binary representation of the constant. Finally, if the statement is a variable, new signals are generated.

The modeling embodiment can be extended, with some special handling, to pointer variables. When a pointer variable is declared, additional variable can be introduced. The number of additional variables can be the same as the number of pointers. For example, the declaration {int *p, *q} will create four variables $v_p'''$, $v_p''$, $v_p'$, and $v_p$ for pointer p, each of which has its own data logic. The same number of variables can be created for q. All the newly generated variables are regular finite domain variables. However, implicitly $v_p$ denotes the referenced value of $v_p'$. The same relationship holds for $(v_p', v_p'')$ and $(v_p'', v_p''')$. Note that an assignment to a pointer will change the face value as well as the referenced values, which result in additional assignments. If there is an assignment {*p=*q;} in the program, the following three assignments are generated: $v_p''=v_q''$, $v_p'=v_q'$, $v_p=v_q$. Similarly, {p=q;} results in four assignments that include $v_p'''=v_q'''$. A dereference in the C code also leads to additional variables and assignments. Let r be an integer variable. An assignment {*p=&r;} will first generate a new variable $v_r'$ that denotes the dereferenced value of $v_r$, and then creates two assignments $v_p'=v_r'$, $v_p=v_r$.

As discussed above, the code simplification process causes sequential assignments in each basic block to become parallel. Consider the following example assignments:

0. ixt ** p; *a, *b, x;
1. p=&a;
2. a=&x;
3. b=*p;
4. *a=5;

The pointers can be handled as discussed above so that two new variables, denoted "&a" and "&x" are created. The additional assignments have to be inferred due to aliasing and newly introduced variables. The first assignment at line 1 becomes $v_p='v_a$. Since p=&a implies *p=a and **p=*a, two new assignments $v_p'=v_a$ and $v_p''=v_a'$ are inferred. The assignment at line 2 gives rise not only to the assignment $v_a'=v_x$ due to a=&x→*a=x, but also to conditional assignments due to aliasing. Since p may be equal to &a, it is possible that *p and **p are assigned new values when a is assigned. This results in the conditional assignments *p=(p==&a)?&x:*p and p=(p==&a)?x:p. Note that b=*p does not need to be considered since &b does not appear in the code. All of the assignments are listed below:

1.1. $v_p='v_a$;
1.2. $v_p'=v_a$;
1.3. $v_p''=v_a'$;
2.1. $v_a'='v_x$;
2.2. $v_a='v_x$;
2.3. $v_p'=(v_p=='v_a)?'v_x:v_p'$;
2.4. $v_p''=(v_p=='v_a)?'v_x:v_p''$;
3.1. $v_b=v_p'$;
3.2. $v_b'=v_p''$;
4.1. $v_a'=5$;
4.2. $v_p''=(v_p'=='v_a)?5:v_p''$;
4.3 $v_b'=(v_b=='v_a)?5:v_b'$;
4.4. $v_x=('v_x=='v_a)?5:'v_x$;

The assignments labeled by m.1 with $1 \leq m \leq 4$ are original assignments, while others are inferred:

Some of the conditions in the conditional assignments can be removed based on the previous assignments in the same basic block. For example, the condition $(v_p=='v_a)$ at 2.3 and 2.4 can be removed because the assignment at 1.1 forces the condition to be true. Therefore, the assignments at 2.3 and 2.4 can be evaluated to $v_p'='v_x$ and $v_p''=v_x$, respectively. The assignments at 2.1 and 2.3 together imply the condition $v_p'=='v_a$ at 4.2 to be true. Similarly, the conditions at 4.3 and 4.4 are true. Therefore, the conditional assignments can be simplified to the following form:

2.3. $v_p'='v_x$;
2.4. $v_p''=v_x$;
4.2. $v_p''=5$;
4.3. $v_b'=5$;
4.4. $v_x=5$;

Then, in order to convert the sequential assignments to parallel assignments, all possible read-after-write hazards are removed. By doing so, the read variables on the right hand side are replaced with the assigned value if the same variables were assigned previously in the same basic block. As a result, the assignments at 3.1 and 3.2 would be changed to $v_b=v_a$ and $v_b'=v_a'$, respectively. In addition, some assignments are redundant when considering a basic block as one atomic step. In particular, the assignments at later steps may overwrite previous assignments. The final assignments after removing prior assignments is shown below:

1.1. $v_p='v_a$;
2.1. $v_a'='v_x$;
2.3. $v_p'='v_x$;
3.1. $v_b=v_a$;
4.1. $v_a'=5$;
4.2. $v_p''=5$;
4.3. $v_b'=5$;
4.4. $v_x=5$;

Note that the assignments now can be considered executed in parallel.

It should be noted that the present invention is not limited to the specific modeling techniques described above. For example, and without limitation, one can use an alternative translation such as the more conventional one of modeling the heap as a set of locations.

ABSTRACTION. Abstraction is probably the most important technique for reducing the state explosion problem in model checking. Predicate abstraction has emerged to be a powerful and popular technique for extracting finite-state model from complex, potentially infinite state systems. As depicted in FIG. 1, the abstraction step 130 takes advantage of the technique of predicate abstraction 132. This approach depends on the ability to identify interesting predicates to be used for abstraction and on the ability to compute abstract transitions correctly. In contrast to early work on predicate abstraction for software which uses extensive and inherently expensive calls to various theorem provers to compute the transition relations in the abstract system, it is advantageous to follow a SAT-based approach to compute the transition relation, as disclosed herein. Additionally, and as further discussed below, it is advantageous to allow the computation of approximate abstract models and to constrain the implementation of the enumeration of the various transition relations to reuse certain common computations, thereby allowing faster computation.

Consider a set of n Boolean predicates $P=\{p_1, \ldots, p_n\} \subset \Sigma$. The truth values to these Boolean predicates are to be updated after the election of each block given the values to the Boolean predicates when entering the considered block. Define a function Preds: $2^x \rightarrow 2^P$ that maps a set M of variables to the predicates that range over these variables and their references and dereferences $Preds(M)=\{p \in P | Vars(p) \cap M \neq \emptyset\}$. The set of required variables for a predicate p given a parallel assignment $v_1, \ldots, v_n \leftarrow e_1, \ldots e_n$ is $$R(p)=\{x \in X | v_i \in Vars(p) \wedge x \in Vars(e_i)\} \subseteq X.$$

Although the variables in R(p) influence p directly, it is necessary to include more predicates and variables into the analysis to reach the full precision provided by the predicate set P as $$R(p,P)=R(p) \cup \{\chi \in R(q) | v \in R(p,P) \wedge q \in Preds(\{v\})\},$$

which can also be computed iteratively. This can be generalized for a set of predicates $P \subseteq P$ to $R(P,P)=\cup_{p \in P}R(p,P) \subseteq X$. The sets of unused variables for a predicate p and a set of predicates P can then be defined as $U(p,P)=X\backslash(Vars(p) \cup R(p,P))$ and $U(P,P)=X\backslash(Vars(P) \cup R(P,P))$. For a parallel assignment, the set of predicates to be updated can be defined as $P_V=Preds(V)$, the set of predicates required as $P_R=Preds(R(P,P))$ and the set of unused predicates as $P_{U=P\backslash(P_V \cup P_R)}$.

For each predicate $p \in P$ a new Boolean variable b can be added to the abstraction of the program. For the set $P=\{p_1, \ldots, p_n\}$, consider an abstraction based on the set $B=\{b_1, \ldots, b_n\}$. For notational convenience, consider the evaluation of the Boolean representation often to be a vector $b=(b_1, \ldots b_n)^T \in B^n$ rather than a set. The following discussion discloses two ways of implementing the computation of a transition relation describing the current-state to next-state relationship for these Boolean variables $b_i$. In this context, the current-state of a Boolean variable denotes the evaluation of the Boolean variable when entering a new basic block, while the next-state denotes the evaluation of the same Boolean variable after executing all statements in the basic block, that is, just before exiting the basic block. It should be noted that the initial state of the abstraction is completely random, that is any truth combination to B is valid.

More formally, define the set $T=\{0, 1, \bot, ?\}$ as a superset of B for abstraction purposes. The symbol $\bot$ corresponds to the same symbol in the concrete state-space, namely a predicate evaluates to $\bot$ when it is out-of-scope in a given basic block. The symbol "?" is used to denote the fact that although the predicate is defined in a given basic block, we are not interested in its evaluation to true(1) or false(0). This notation can be used for the description of approximate abstractions.

The set of abstract states $Q^P$ for a vector of predicates $P \in \Sigma^n$ of length n is thus $Q^P = L \times T^n$. Similar to the concrete state-space, define a location-specific set $T_l^P$ which only contains consistent vectors b with respect to the scope of predicates for a given location l. The set of initial abstract states then is $Q_0^P = \{(l_0, b) | b \in T_{l_0}^P\}$.

The concretization $\gamma(b)$ of a Boolean predicate vector $b=(b_1, \ldots, b_n)^T \in B^n$ is the set of true assignments to the expression $$\gamma(b)=\{x \in X | b_1 \Leftrightarrow p_1(x) \wedge \ldots \wedge b_n \Leftrightarrow p_n(x)\}$$

Assuming one knows the range of all variables in $P_V$, a bit-blasted expression can be generated that can be used to enumerate all such assignments using the algorithm described in K. L. McMillan, "Applying SAT Methods in Unbounded Symbolic Model Checking," in $14^{th}$ Int'l Conference on Computer Aided Verification, Vol. 2404 of Lecture Notes in Computer Science, pp. 250-64 (2002). The range analysis framework can be used to find an appropriate bitwidth for each variable and statement in the program. Note also that it is easy to extend these definitions to the set T instead of B, as well as to extend it to the abstract states $Q^P$. If one considers the concrete transition relation $\leftarrow \subseteq Q \times Q$, one can then define the abstract transition relation $\leftarrow^P \subseteq Q^P \times Q^P$ given a vector of predicates P as:

$$(l_1,b_1) \rightarrow^P (l_2,b_2) :\Leftrightarrow b_1 \in T_{l_1}^P \wedge b_2 \in T_{l_2}^P \wedge \exists x_1 \in \gamma(b_1), x_2 \in \gamma(b_2).(l_1,x_1) \rightarrow (l_2,x_2).$$

If $\sigma \in \Sigma$ is an expression, $Y \subseteq X$ is a set of k variables, and $\sigma_1, \ldots, \sigma_k$ are k expressions, then $\sigma[Y \leftarrow \sigma_1, \ldots, \sigma_k]$ denotes the expression obtained by point-wise substitution of the expressions $\sigma_i$ for the variables Y in $\sigma$.

For a block with assignment set V, a set of updated predicates $P_V$, and the set of required predicates $P_R$, the set B can be partitioned accordingly into sets $B_V$ and $B_R$, corresponding to $P_V$ and $P_R$ respectively. A Boolean expression can be obtained representing a transition relation T(b, $b_j'$, X) for the next state of a Boolean variable $b_j'$ for a Boolean variable $b_j \in B_V$ depending on the current state Boolean variables in $B_R$ as $$\mathcal{T}(b, b_j', \chi) := \bigwedge_{b_i \in B_R} b_i \Leftrightarrow p_i \wedge b_j' \Leftrightarrow p_j[V \leftarrow e_1, \ldots, e_n].$$

(It should be noted that the set $B_R$ was computed on the basis of all predicates, and can be relaxed if a single predicate at a time is being considered. That is, if a single predicate p is considered, the set $P_R$ is Preds(R(p))). Similarly, a Boolean expression can be obtained which represents a transition relation T(b, b', X) for the next state of all Boolean variables in $B_V$ depending on the current state Boolean variables in $B_R$ as $$\mathcal{T}(b, b'\chi) := \bigwedge_{b_i \in B_R} b_i \Leftrightarrow p_i \wedge \bigwedge_{b_i \in B_V} b'_i \Leftrightarrow p_i[V \leftrightarrow e_1, \ldots, e_n] \wedge \bigwedge_{b_i \notin B_V} b'_i = b_i.$$

The above transition relations can be restricted to range only over Boolean variables by defining $T(b,b'):=x\in X.T(b, b', x)$, and $T(b,b'_j):=\exists x\in X.T(b,b'_j,x)$. For notational convenience, we also denote the set $\{y'|y\in M\}$ for any set M using the notation M'. Hence, we use $B_V'$ to denote the set $\{b_i'|b_i\in B_V\}$.

For each basic block, one transition relation T(b, b', X) is thus generated. Every satisfying assignment A of the transition relation represents a transition in the concrete system—the considered C-block—and its abstraction given the current set of Boolean predicates. In order to compute T(b,b'), one can project such a satisfying assignment onto the Boolean variables b and b', and thus obtain one possible transition in the abstracted system by defining an abstract satisfying assignment $A_B$ as $A_B=A_{|B_R\cup B_V'}$. Since one is only interested in finding all possible transitions in the abstract system, an efficient implementation of the enumeration algorithm can be used. See McMillan reference above. The enumeration of abstract transitions proceeds by iterative additions of so-called blocking clauses that disallow a previous solution to reappear. After adding the blocking clause $\neg A_B$ to the Boolean expression, T(b, b', X), the SAT-solver can then be asked to find another satisfying assignment of the enriched problem formulation, if such an assignment still exists. The enumeration of the transition relation using a SAT-solver is a more efficient way of computing the transition relation compared to using expensive and exponentially many calls to a theorem prover.

The implementation of the enumeration of the various transition relations can be further improved by constraining the implementation to reuse certain common computations, thereby allowing faster overall computation. Since many transition relations need to be computed, where the set of considered Boolean variables often remains only partially the same, an intelligent scheduling of the enumeration of these transition relations and a proper memory management of derived implications, can potentially reduce the computation time of the overall abstraction procedure as viewed for the entire program significantly.

It should be noted that in many cases the set of n predicates does not imply that there are $2^n$ many consistent abstract interpretations of these predicates. In fact, as it turns out, often there are many redundant or parallel predicates where many combinations of these evaluations do not correspond to any concrete state. A simple preprocessing step analyzing whether predicates are parallel to each other can save considerable time at run-time. Consider for example a case that involved 35 relevant predicates which could be divided into four sets of parallel predicates of size eight, eight, nine and nine and a single non-parallel predicate. Parallel predicates in the present context includes predicates such as $$2x - y - \frac{4z}{5} = 2, 2x - y > 5 + \frac{4z}{5},$$

and $2x-0.8z<y$. In such a set of nine parallel predicates, for example, there are at most ten consistent evaluations whereas a full search would loop over $2^9$ many combinations. In the previously mentioned case, the 35 predicates thus can at most represent $2\cdot 9^2\cdot 10^2<2^{14}$ many abstract consistent states. This reduces the analysis at this point of the computation by a factor of more than $2^{21}>2\cdot 10^6$. The total saved computation time is a multiple of this since this saving can be re-used in multiple transition relation computations.

In addition to the above-described analysis of parallel predicates, there are often other non-consistent evaluations of the predicates in the concrete state-space. For example, for a set of separation predicates which are predicates of the form $x_i-x_j\sim c$ with $\sim\in\{>,\geq\}$ and c a constant, one can decide the valid combination of the set of these predicates. Such reductions of the set of feasible valid combinations can be helpful for later processing steps if the set of feasible combinations can be expressed concisely. A full enumeration of the feasible combinations may also be possible; however, the resulting set of feasible combinations may not be concise enough. It is also helpful to discover certain relationships and implications during an enumeration and remember these for later computation steps.

For the enumeration of the transition relation from current-state to next-state Boolean variables, the effect of reducing the size of the feasible Boolean predicate truth combinations shows up both in the current-state representation as well as the next-state representation of these variables. In addition, an analysis of various basic block computations and an intelligent scheduling of the enumeration of various transition relations can significantly save time during the computation of the abstraction. Consider, for example, the following code fragment which is often found in some similar form in many software applications:

```
if ( condition )
    x++ ; /* then-part */
else
    x += 2 ; /* else-part */
```

For illustration purposes, consider here two predicates $b_1$ representing x>2 and $b_2$ representing x>3. Then, the expression x>1 represents the pre-condition for $b_1'$ to be true in the then-part of the code fragment, written as $b_1'^{(then)}$, while it also represents $b_2'^{(else)}$. One can thus save one whole computation of transition relations by combining the two enumerations into one. Thus, one can enumerate the following expression $$b_1 \Leftrightarrow_{x>2} \wedge b_2 \Leftrightarrow_{x>3} \wedge b_1'^{(then)} \Leftrightarrow_{x>1} \wedge b_2'^{(then)} \Leftrightarrow_{x>2} \wedge b_1'^{(else)} \Leftrightarrow_{x>0} \wedge b_2'^{(else)} = b_1'^{(then)}.$$

(It should be noted that this is a simple case where further preprocessing could be performed; these are omitted in the presentation for clarity purposes, and it should also be noted that the size of the reduction increases by incorporating more predicates). Even if the computation cannot be combined in the way as presented above, it is often the case that the set of considered Boolean predicates and instructions is partially the same in various transition relations representing different basic blocks. An analysis of these cases and a scheduling that allows the enumeration of common parts first, can then be used to minimize the amount of total computations needed for all transition relations.

The overall run-time can be further reduced by allowing the computation of approximate abstract models to reduce the abstraction time. For example, while it may not be feasible to enumerate the set of possible solutions for the full transition relation between current-state and next-state Boolean predicate variables, it may be possible to reduce the run-time by enumerating multiple transition relations where only a subset of or even individual next-state Boolean predicate variables are considered at a time. For example, if not all these transition relations can be enumerated, it may be possible to leave some transition relations unspecified thus allowing a non-deterministic choice to the following model checking step. On the other hand, an approximation can also be computed based on the overall transition relation by excluding some abstracted satisfying assignments from further consideration. Such decisions are usually made based on a predetermined maximal length of clauses to be considered. To compute an approximate abstraction, it has been noted that it is only necessary to check the following expressions for unsatisfiability. The transition in the abstract state-space between the abstract states $(l_1, b_1)$ and $(l_2, b_2)$ is included in the approximate transition relation, that is $(l_1, b_1) \rightarrow (l_2, b_2)$, if and only if the expression $$\exists x_1 \in \gamma(b_1), x_2 \in X_{l_2} \backslash \gamma(b_2) \wedge (l_1, x_1) \rightarrow (l_2, x_2)$$

is unsatisfiable. By limiting the number of significant predicates to a small constant, that is by iterating only over abstract states with a pre-determined number of 0's or 1's in their predicate vector representation and ? and $\perp$ appropriately elsewhere, an over-approximation of the transition relation can be simply constructed. One can also distinguish between the number of significant bits in the current-state $(l_1, b_1)$ and the next-state $(l_2, b_2)$ during this iteration. Since approximations of the transition relation $\rightarrow^P$ are allowed, one can denote the approximate transition relation as $\hookrightarrow^P$ and perform the reachability analysis in general using the transition relation $\hookrightarrow^P$.

COUNTER-EXAMPLE ANALYSIS & REFINEMENT. Allowing an over-approximation of the considered abstraction model thus reduces the run-time of the computation of the abstraction, but also increases the risk that spurious counter-examples will appear during the model checking phase. Accordingly, as set forth in FIG. 1, the system performs an analysis searching for such spurious counter-examples at 160 and further refinement at 170.

The concept of spurious counter-examples can be generalized to testing for the feasibility of sub-paths or "fragments." Formally, define an abstract path of length k in the abstract state-space $Q^P$ for a set of predicates P given a set of unsafe locations Bad $\subseteq L$ as a sequence of k abstract states $(l_0, b_0), \ldots (l_{k-1}, b_{k-1})$ such that $(l_0, b_0) \in Q_0^P$ is an initial abstract state and $\forall 0 \leq i \leq k-1: (l_i, b_i) \rightarrow^P (l_{i+1}, b_{i+1})$. An abstract counter-example of length k then is a path that ends in an unsafe location, that is $l_{k-1} \in Bad$. However, since approximate transition relations are allowed, define approximate abstract paths and approximate abstract counter-examples analogously using the relation $\hookrightarrow^P$ instead of $\rightarrow^P$. For the counter-example analysis, define an expression that corresponds to a fragment of the counter-example of length k. Define a timed version of the transition relation $\rightarrow$ in the concrete state-space or a time-step or unrolling i with $0 \leq i \leq k-1$ over the timed or unrolled variables as $T^i$. Since the sequence of basic blocks in an approximate abstract path $(l_0, b_0), \ldots, (l_{k-1}, b_{k-1})$ is known, one can for efficiency purposes additionally limit the various timed relations $T^i$ in the implementation to the appropriate transition in the control flow graph to the basic block transition from $l_i$ to $l_{i+1}$. Fragments can then be defined for $0 \leq i < j < k$ as:

$$\phi(i,j) := \gamma(b_i) \wedge T^i \wedge \gamma(b_{i+1}) \wedge \ldots \wedge T^{j-1} \wedge \gamma(b_j).$$

If the expression $\phi(i,j)$ is unsatisfiable for any pair $0 \leq i < j < k$, it has been discovered that the counterexample is indeed spurious.

It should be noted that prior art analysis and refinement approaches consider spurious transitions, which consider fragments of the form j=i+1. Also, traditional prefix counter-example analysis approaches consider only fragments of the form i=0 with a minor addition. Namely, when including the first abstract state, it is also necessary to verify that a possible path through the counter-example starts within the set of initial states. However, in the present case, since all well-defined states in $X_{l_0}$ in basic block $l_0$ are defined to be initial, this check can be omitted here. For the full counter-example analysis, thus, the system simply considers the expression $\phi := \phi(0, k-1)$.

The additional work invested to discover better reasons for spurious counter-examples thus yielding stronger predicates, can reduce the number of iterations needed to prove or disprove reachability in the overall counter-example-guided abstraction refinement approach significantly. This kind of analysis of fragments will increasingly be more important the longer the counter-examples become. While the reason for a spurious counter-example may be a local problem in a sequence of relatively few abstract states, the prefix analysis as advocated so far in all other counter-example-guided refinement approaches may distort the real reason and discover a sub-quality set of new predicates. A similar counter-example with a very similar spurious fragment can still re-appear in the following iterations if it is not accounted for during prior analysis and refinement steps.

Where a SAT solver is utilized as the model checker, the SAT solver can generate a subformula that is unsatisfiable, otherwise known as an unsatisfiability core. The refinement of spurious counterexamples can be further focused by using the unsatisfiability cores computed by the SAT solver.

CUSTOMIZED DECISION HEURISTICS. The Boolean representations generated by the system contain many common features that are based on the particular translation presented here. Although the program counter described above tracks progress in the control flow graph, there is additional information in the original software that could improve the efficiency of the model checking. In the context of bounded model checking, there are various heuristics that can improve the performance.

Scoring of PC Variables. A simple decision heuristic that increases the likelihood that a SAT solver makes decisions first on variables that correspond to the control flow rather than the data flow, takes advantage of the fact that each new unrolling does not allow the whole code to be reached based on a static analysis of the control flow graph. This heuristic can be implemented by increasing the score for the bits of the pc variables, which in turn makes the back-end SAT solver choose these variables as decision variables first. This heuristic forces the model checker to focus first on a static reachability computation of the control flow graph and is, thus, able to eliminate many traces quickly. In addition to scoring pc variables higher than other variables in the system, it can also be advantageous to control how to vary the scoring of variables over various time frames. For example, increasing the relevance of pc variables more in later time-frames than in previous ones takes advantage of the SAT-solver decisions inherent in the above-mentioned DIVER tool.

One-Hot Encoding. Another heuristic that is useful is a one-hot encoding of the pc variables which allows the SAT solver to make decisions on the full pc. In addition to the binary encoded pc variable already present in the circuit, a new selection bit can be added for each basic block. The selection bit can be set iff the basic block is active, i.e., when a certain combination of pc variables bits is valid. This provides a mechanism for word-level decisions since a certain basic block selection bit automatically invalidates all other basic block selection bits through the pc variables. By increasing the score to set a basic block selection bit compared to other variables in the system, one is able to influence the SAT solver to make quick decisions on the location first. An obvious disadvantage to this heuristic is that one needs to include one selection bit to the Boolean model per basic block in the software program.

In addition, one is able to increase the score intelligently for these basic block selection bits by considering the pre-computed static reachability information from the control flow graph. One only needs to increase the score for those basic block selection bits at depth k, if the corresponding basic block can actually be reached statically in the control flow graph at depth k. This requires an additional BFS of reachable basic blocks at various depths on the control flow graph.

Consider the control flow graph illustrated by FIG. 5. Each basic block in the control flow graph can be given a unique number which would be used to describe the one-hot encoding. Let $b_i$ represent the selection bit for basic block i and let $c_i$, $0 \leq i \leq 3$ represent the four needed program counter variable bits. Constraints can be added for each basic block, asserting the equality of the basic selection variable with the binary-encoded program counter label. For example, $b_0 = \bar{c}_3 \bar{c}_2 \bar{c}_1 \bar{c}_0$ and $b_6 = \bar{c}_3 c_2 c_1 \bar{c}_0$. Now, a decision by the SAT-solver to assign $b_0$ to 1 corresponds to a word-level decision on the program counter, which immediately results in implying $b_i = 0$, i>0, including $b_6 = 0$ in the example.

Furthermore, similar to the previously described advantage to score variables in later time-frames higher than in prior time-frames, it is also possible to use the same strategy for the scoring of the selection bits described in this heuristic.

Explicit Modeling of CFG Transitions. It is also advantageous to aid the analysis of the back-end SAT-solver by constraining its search space to eliminate impossible predecessor basic block combinations in the control flow graph. These constraints capture additional high-level information, which helps to prune the search space of the SAT-solver. At each depth, the choice of the SAT-solver to consider a particular basic block enables a limited number of possible predecessor blocks and eliminates immediately all other basic blocks from consideration. By increasing the likelihood that the SAT-solver decides first on the pc, one can take advantage of the fact that each new unrolling does not allow the whole code to be reachable at each depth. It is preferable to add these constraints based on incoming transitions into a basic block since the Boolean model of the software already encodes the outgoing transitions in terms of the pc variables.

For example, assuming that $c_i'$ with $0 \leq i \leq 3$ denotes the next state pc variables bits, the following constraint is added for basic block 7 of FIG. 5: $c_3'c_2'c_1'c_0' \rightarrow (\bar{c}_3\bar{c}_2 c_1 c_0 \vee \bar{c}_3 c_2 \bar{c}_1 \bar{c}_0)$. Similarly, for basic block 3, add the following constraint: $c_3'\bar{c}_2'c_1'c_0' \rightarrow (\bar{c}_3\bar{c}_2\bar{c}_1 c_0 \wedge g)$, where g stands for the representation of "x>4". Such constraints can also be added in terms of the one-hot encoded selection bits of the basic blocks if both these heuristics are being utilized. The constraint for basic block 7 then simply becomes $b_7' \rightarrow (b_3 \vee b_4)$. With the addition of this constraint, if the SAT-solver assigns $b_7'$ to 1, i.e., the current block is 7, then the predecessor block is required to be one of the blocks 3 or 4.

This heuristic can be customized by choosing a subset of basic blocks for which to apply the heuristic. This customization allows the user to fine-tune the amount of additional constraints generated, since too many additional constraints may burden the SAT-solver rather than improve efficiency. For example, and without limitation, a user can be allowed to specify the following choices:

Include additional constraints for all basic blocks in the control flow graph.

Include additional constraints only for those basic blocks that have multiple incoming transitions. This option requires the SAT-solver to pick one incoming edge when there are several choices. This allows the SAT-solver to quickly focus on a single feasible path at a time.

Include additional constraints only for those basic blocks that have a single incoming transition. This option helps the SAT-solver to quickly propagate a path backwards when there are no multiple incoming edges. This process alleviates unnecessary decisions on pc variables immediately in such basic blocks.

In addition, another optimization is to limit the additional constraints to basic blocks at depths that are actually reachable at that depth. This optimization, similar to the optimization described above in the one-hot encoding heuristic, requires an additional BFS of reachable basic blocks.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow and their structural and functional equivalents. As but one of many variations, it should be understood that programming languages other than C can be readily utilized in the context of the present invention.

What is claimed is:

1. A computer-implemented method of verifying a software program comprising:

determining one or more properties of the software program to be verified;

generating a model of the software program wherein said model comprises a Boolean representation having a plurialty of basic blocks, each basic block representing a sequence of one or more instructions in the software program as a set of parallel assignments and a set of transitions to other basic blocks;

applying a SAT-based model checker to the Boolean representation of the software program; and determining whether the properities are correct and generating an output indicative of that correctness determination for the software program;

wherein said model of the software program is one of a type selected from the group consisting of: bounded-recursive and non-recursive;

wherein transition relations in the Boolean representation of the software program are enumerated and represented by:

$$\mathcal{T}(b, b', \chi) := \bigwedge_{b_i \in B_R} b_i \Leftrightarrow p_i \wedge \bigwedge_{b_i \in B_v} b'_i \Leftrightarrow p_i[V \leftarrow e_1, \ldots, e_n] \wedge \bigwedge_{b_i \notin B_v} b'_i = b_i$$

where b,b'$_i$ are boolean variables in an abstract model; X is the set of all variables in the program; $b_i$ denotes an element of a Boolean predicate vector; $B_R$ is a set of Boolean variables computed on the basis of all predicates; $p_i$ is a single predicate being considered $p_j$ is an expression in terms of variables used in a concrete model; V is set to values of concrete variables and e are expressions of assignments made to those variables in a basic block.

2. A computer-implemented method of verifying a software program comprising:

determining one or more propoerties of the software to be verified;
  generating a model of the software program wherein said model comprises a Boolean representation having a plurality of basic blocks, each basic block representing a sequence of one or more instructions in the software program as a set of parallel assignments and a set of transitions to other basic blocks;
  applying a SAT-based model checker to the Boolean representation of the software program; and
  determining whether the properties to be verified are correct; and
  generating an output indicative of that correctness determination for the software program;
  wherein said model of the software program is one of a type selected from the group consisting of: bounded-recursive and non-recursive;
  wherein transition relations in the Boolean representation of the software program are enumerated using SAT-based enumeration; and
  wherein transition relations in the Boolean representation of the software program are enumerated and represented by:

$$\mathcal{T}(b, b'_j, \chi) := \bigwedge_{b_i \in B_R} b_i \Leftrightarrow p_i \wedge b'_j \Leftrightarrow p_j[V \leftarrow e_1, \ldots, e_n]$$

where b,b'$_j$ are boolean variables in an abstract model; X is the set of all variables in the program; $b_i$ denotes the Boolean predicate vector; $B_R$ is a set of Boolean variables computed on the basis of all predicates; $p_i$ is a single predicate being considered; $p_j$ is an expression in terms of variables used in a concrete model; V is set to values of concrete variables and e are expressions of assignments made to those variables in a basic block.

* * * * *